United States Patent
Jan et al.

(10) Patent No.: US 7,304,844 B2
(45) Date of Patent: Dec. 4, 2007

(54) COOLING FAN ASSEMBLY

(75) Inventors: Shun-Yuan Jan, Guangdong (CN);
Tay-Jian Liu, Guangdong (CN)

(73) Assignee: Foxconn Technology Co., Ltd.,
Tu-Cheng, Taipei Hsien (TW)

( * ) Notice: Subject to any disclaimer, the term of this patent is extended or adjusted under 35 U.S.C. 154(b) by 200 days.

(21) Appl. No.: 11/162,835

(22) Filed: Sep. 26, 2005

(65) Prior Publication Data

US 2006/0139881 A1   Jun. 29, 2006

(30) Foreign Application Priority Data

Dec. 24, 2004   (TW) .............................. 93140460 A

(51) Int. Cl.
*H05K 7/20* (2006.01)
*F01D 25/26* (2006.01)
*F01D 1/00* (2006.01)

(52) U.S. Cl. .................. 361/697; 361/695; 415/213.1; 415/219.1; 415/220

(58) Field of Classification Search ..................... None
See application file for complete search history.

(56) References Cited

U.S. PATENT DOCUMENTS

| | | | | |
|---|---|---|---|---|
| 5,940,268 | A * | 8/1999 | Miyahara et al. | 361/697 |
| 6,023,413 | A * | 2/2000 | Umezawa | 361/697 |
| 6,031,720 | A | 2/2000 | Crane, Jr. et al. | |
| 6,315,525 | B1 * | 11/2001 | Webb | 417/313 |
| 6,746,205 | B2 * | 6/2004 | Huang et al. | 415/116 |
| 6,908,282 | B2 * | 6/2005 | Yu | 415/211.2 |
| 6,910,862 | B2 * | 6/2005 | Horng et al. | 415/211.2 |
| 6,969,234 | B2 * | 11/2005 | Lin | 415/214.1 |
| 6,991,425 | B2 * | 1/2006 | Kruegel et al. | 415/122.1 |
| 7,004,726 | B2 * | 2/2006 | Kuo | 416/247 R |
| 7,110,255 | B2 * | 9/2006 | Ko et al. | 361/695 |
| 7,134,839 | B2 * | 11/2006 | Horng et al. | 415/199.4 |
| 2003/0007867 | A1 * | 1/2003 | Chang | 415/220 |
| 2005/0089402 | A1 * | 4/2005 | Horng et al. | 415/186 |
| 2006/0188370 | A1 * | 8/2006 | Chen et al. | 415/220 |

FOREIGN PATENT DOCUMENTS

| | | |
|---|---|---|
| CN | 2406092 Y | 11/2000 |
| CN | 2442007 Y | 8/2001 |
| TW | 200403394 A | 3/2004 |

* cited by examiner

*Primary Examiner*—Boris Chervinsky
(74) *Attorney, Agent, or Firm*—Winston Hsu

(57) ABSTRACT

A cooling fan assembly includes a cooling fan (1) having a rotary hub (14) and a plurality of fan blades extending radially from an outer periphery of the hub, a hood (20) connected with the cooling fan, and a guiding member (40) located in a center of the hood. The hood forms an air inlet (22) near the cooling fan and an air outlet (24) far from the cooling fan. The guiding member is located close to hub of the cooling fan and so configured that a low pressure area is prevented from being formed in the hood near the hub, wherein the guiding member guides an airflow generated by the cooling fan to flow from the air inlet toward the air outlet.

20 Claims, 6 Drawing Sheets

COOLING FAN ASSEMBLY

FIELD OF THE INVENTION

The present invention relates to a cooling fan assembly for dissipation of heat from a heat generating device, and particularly to a cooling fan assembly having a fan duct device for guiding an airflow generated by a cooling fan to a heat sink with increased speed and pressure for the airflow.

DESCRIPTION OF RELATED ART

As computer technology continues to advance, electronic components such as central processing units (CPUs) of computers are being made to provide faster operational speeds and greater functional capabilities. When a CPU operates at high speed in a computer enclosure, its temperature can increase greatly. It is desirable to dissipate the generated heat quickly, for example, by using a heat sink attached to the CPU in the enclosure. A cooling fan is attached on the heat sink. The cooling fan generates an airflow through the heat sink thereby to improve heat dissipation of the heat sink. Thus, the heat generated by the CPU can be timely released.

FIG. 6 discloses a cooling fan assembly comprising a heat sink 240 attached to a heat generating device 250, a cooling fan 220 arranged on the heat sink 240, and a fan duct 221 arranged between the cooling fan 220 and the heat sink 240. The cooling fan 220 comprises a hub 210 and a plurality of fan blades extending outwardly from an outer periphery of the hub 210. The cooling fan 220 has a flat bottom wall under the hub 210 facing the heat sink 240. An area of a cross section of the fan duct 221 gradually decreases from the cooling fan 220 to the heat sink 240. During rotary motion of the cooling fan 220, an airflow produced by the cooling fan 220 flows through the fan duct 221 to the heat sink 240.

When the airflow flows toward the heat sink 240, a low pressure area 230 is formed just below the hub 210 of the cooling fan 220 due to the flat bottom wall of the cooling fan 220 under the hub 210. Reflux of the airflow due to rebounding of the airflow respective to the heat sink 240 enters the low pressure area 230. Thus a turbulent flow is produced in the low pressure area 230, which significantly affects the pressure and the speed of the airflow towards the heat sink 240. Accordingly, heat dissipating effectiveness by the airflow through the heat sink 240 is lowered.

What is needed, therefore, is a cooling fan assembly having a high cooling effectiveness by generating an airflow toward a heat sink without lose of pressure and speed of the airflow, and even with an increase speed and pressure for the airflow.

SUMMARY OF INVENTION

According to a preferred embodiment of the present invention, a cooling fan assembly comprises a cooling fan having a hub and a plurality of fan blades extending radially from an outer periphery of the hub, a hood connected with the cooling fan, and a guiding member located in and secured to the hood. The hood forms an air inlet near the cooling fan and an air outlet far from the cooling fan. The guiding member is located near the hub of the cooling fan so that a low pressure area is prevented from being formed in the hood near the hub. The guiding member is cone-shaped, having a large end near the air inlet and covering a bottom wall of the cooling fan below the hub and a small end near the air outlet. The hood has a cone-shaped body having a large end through which the air inlet is defined, and a small end through which the air outlet is defined. The air outlet is much smaller than the air inlet.

Other advantages and novel features of the present invention will be drawn from the following detailed description of the preferred embodiment of the present invention with attached drawings, in which:

DETAILED DESCRIPTION

Figure 1:
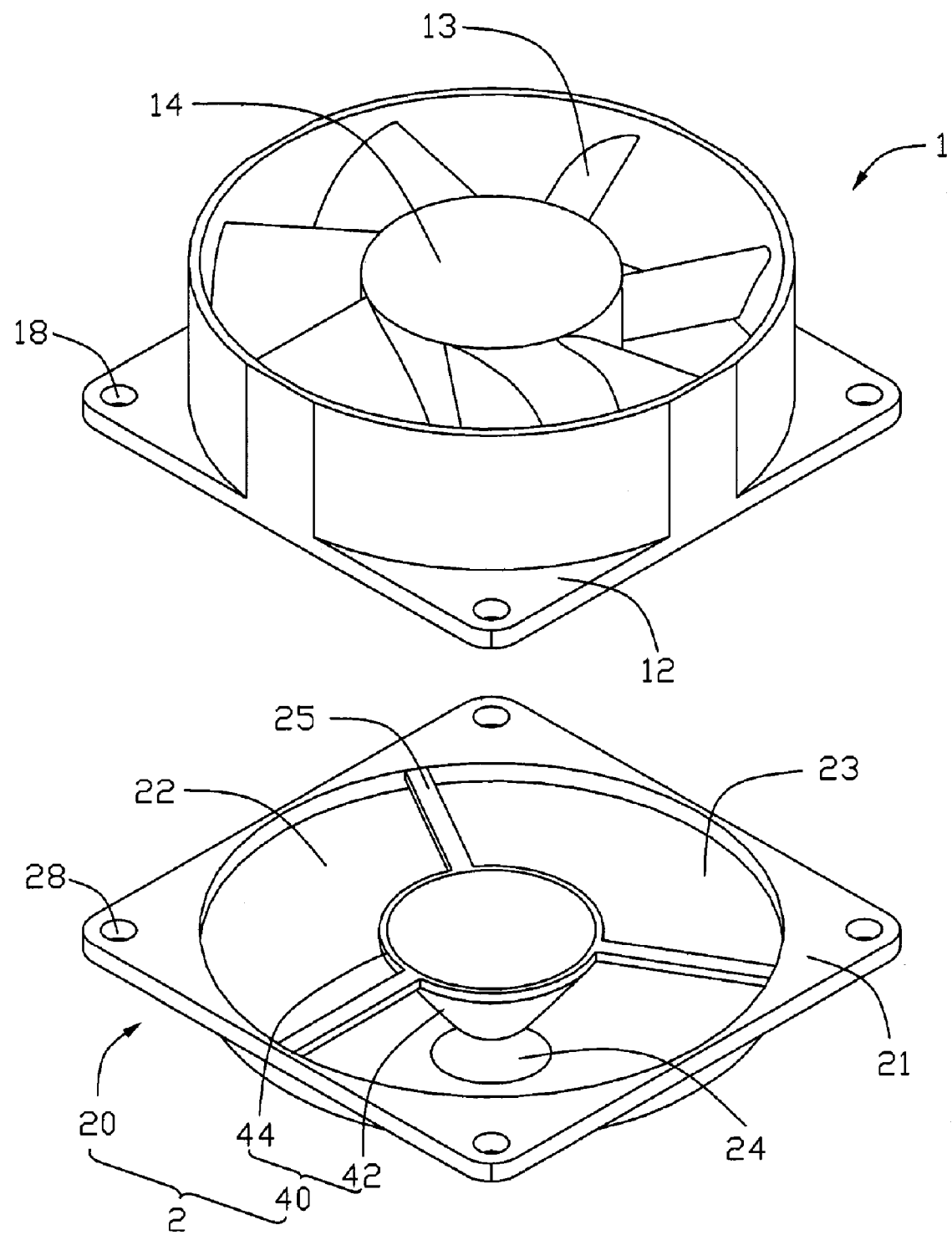
FIG. 1 is an exploded, isometric view of a cooling fan assembly in accordance with a preferred embodiment of the present invention.
Figure 2:
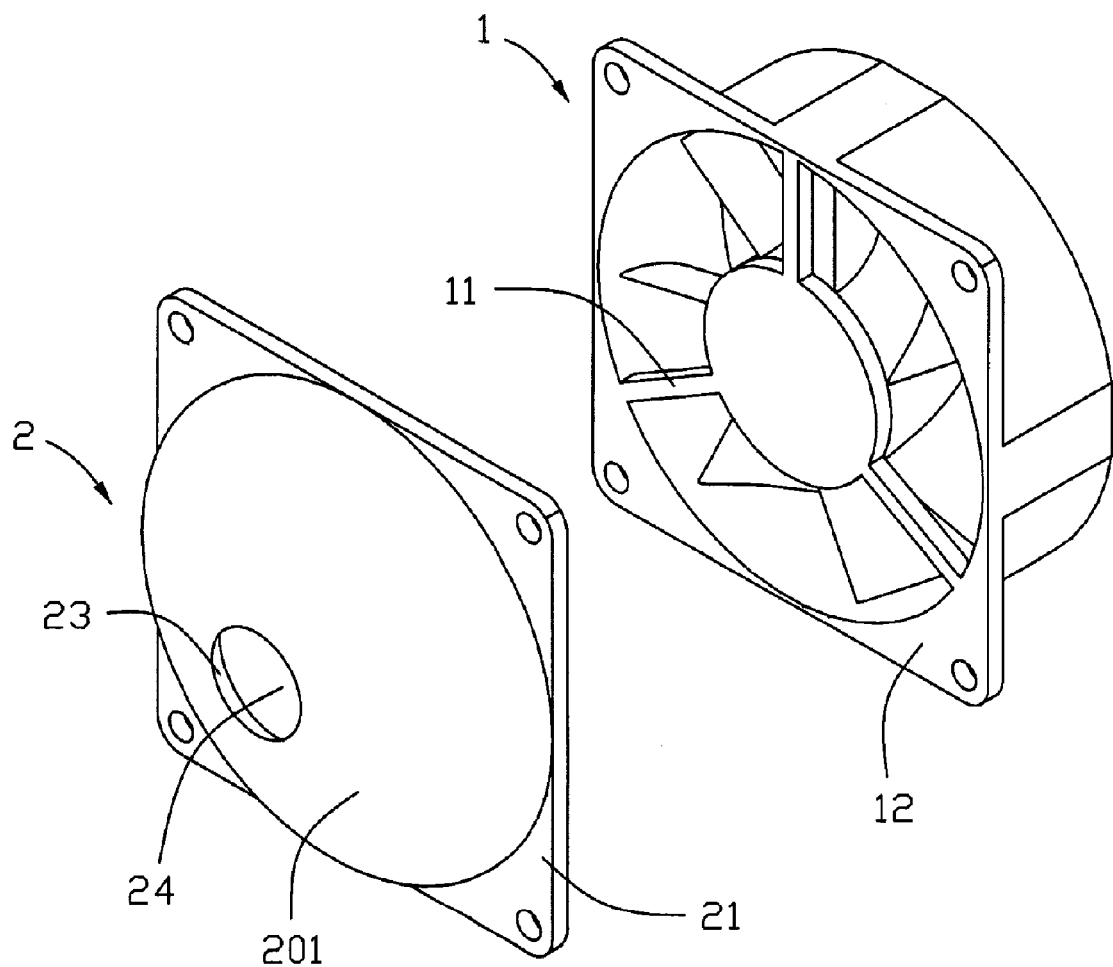
FIG. 2 is viewed from another aspect of FIG. 1.

Referring to FIG. 1 and FIG. 2, a cooling fan assembly according to a preferred embodiment of the present invention comprises a cooling fan 1, and a fan duct device 2 connected with the cooling fan 1. The fan duct device 2 comprises a hood 20 for connection with the cooling fan 1 and a guiding member 40 located in a central portion of the hood 20.

The cooling fan 1 comprises a frame 12, a plurality of ribs 11 extend inwardly from an inner-periphery of the frame 12, a hub 14 rotatably supported by the frame 12 and a plurality of fan blades 13 extending radially from an outer-periphery of the hub 14. A hole 18 is defined in each of four corners of the frame 12.

The hood 20 is hollow and has a cone-shaped central body 201 and a flat flange 21 extending outwardly from a top of the central body 201. The flat flange 21 forms a square base for the hood 20. The hood 20 has an end near the cooling fan 1 defining an air inlet 22 and an opposite end far from the cooling fan 1 defining an air outlet 24. The air inlet 22 is defined through a small bottom end of the central body 201 while the air outlet 24 is defined through a large top end of the central body 201. The top end of the central body 201 is larger than the bottom end thereof. A diameter of the air inlet 22 is approximately the same as a diameter of the cooling fan 1 and much larger than a diameter of the air outlet 24, whereby a nozzle effect can be generated by the fan duct device 2. An area enclosed by the central body 201 gradually decreases along a direction from the air inlet 22 to the air outlet 24 of the hood 20. An inner surface 23 of the central body 201 is streamline shaped. The flange 21 is used for securing the fan duct device 2 to the cooling fan 1. A hole 28 is defined in each of four corners of the flange 21 and correspondent to a corresponding hole 18 of the frame 12 of the cooling fan 1. A plurality of brackets 25 extends inwardly from an inner periphery of the central body 201 to connect with the guiding member 40 and support the guiding member 40 in the center portion of hood 20.

The guiding member 40 is located in a center of the air inlet 22 of the hood 20. The guiding member 40 is hollow and has a cone-shaped cross section. An area enclosed by the guiding member 40 gradually decreases along a direction from the air inlet 22 to the air outlet 24 of the hood 20. An outer surface 42 of the guiding member 40 is streamline shaped as the inner surface 23 of the central body 201. A top end 44 of the guiding member 40 near the cooling fan 1 is larger than a bottom end thereof far from the cooling fan 1. A diameter of the top end 44 is approximately the same as a diameter of the hub 14.

Figure 3:
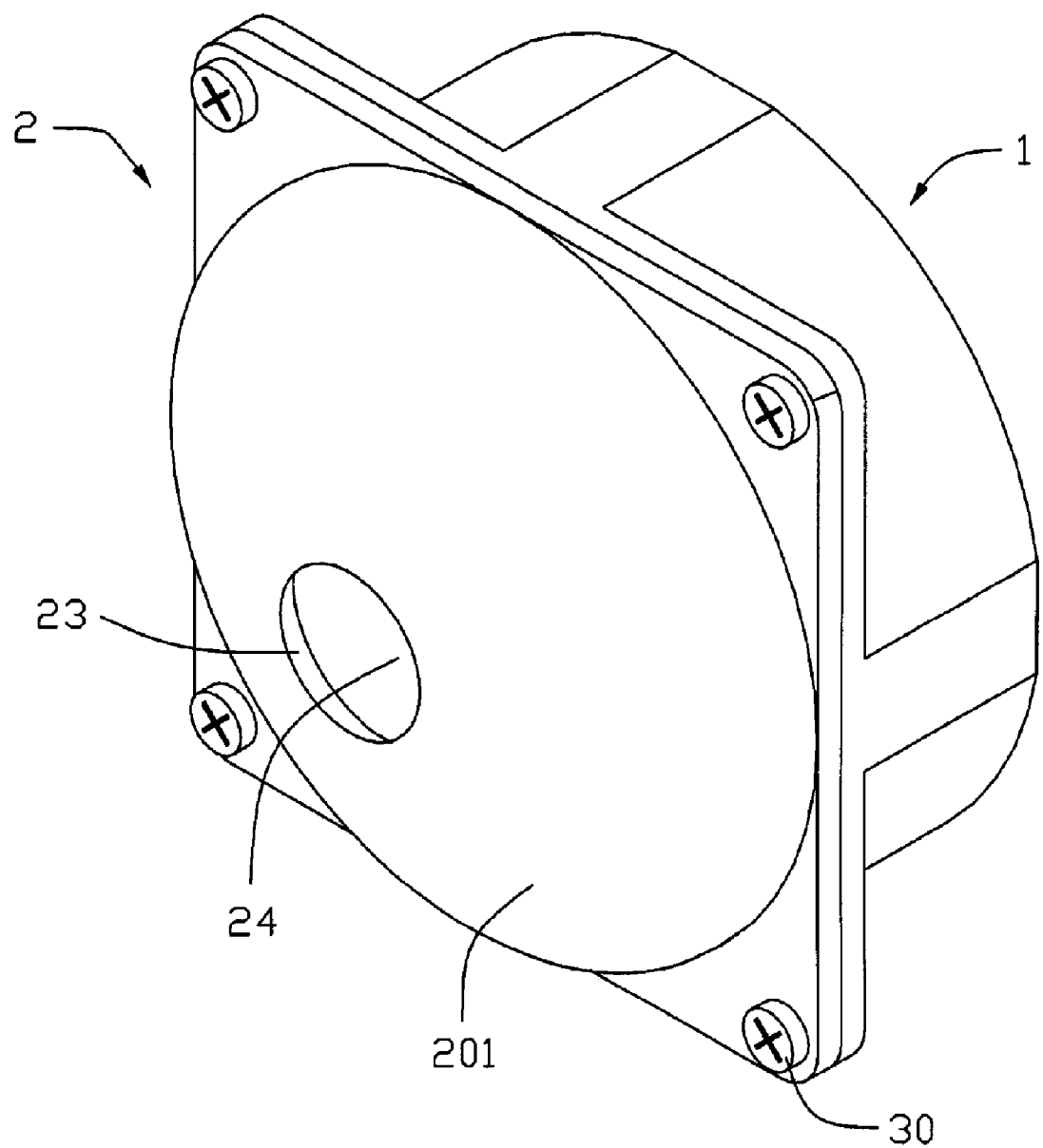
FIG. 3 is an assembled view of the cooling fan assembly of FIG. 1.

Referring to FIG. 3, when the cooling fan assembly is assembled together, the cooling fan 1 abuts the end of the hood 20 having the air inlet 22. A plurality of screws 30 extend through the holes 28 of the flange 21 and screw in the holes 18 of the cooling fan 1, to thereby secure the fan duct device 2 and the cooling fan 1 together. When the cooling fan assembly assembled, a concave of the guiding member 40 faces the hub 14 of the cooling fan 1.

Figure 4:
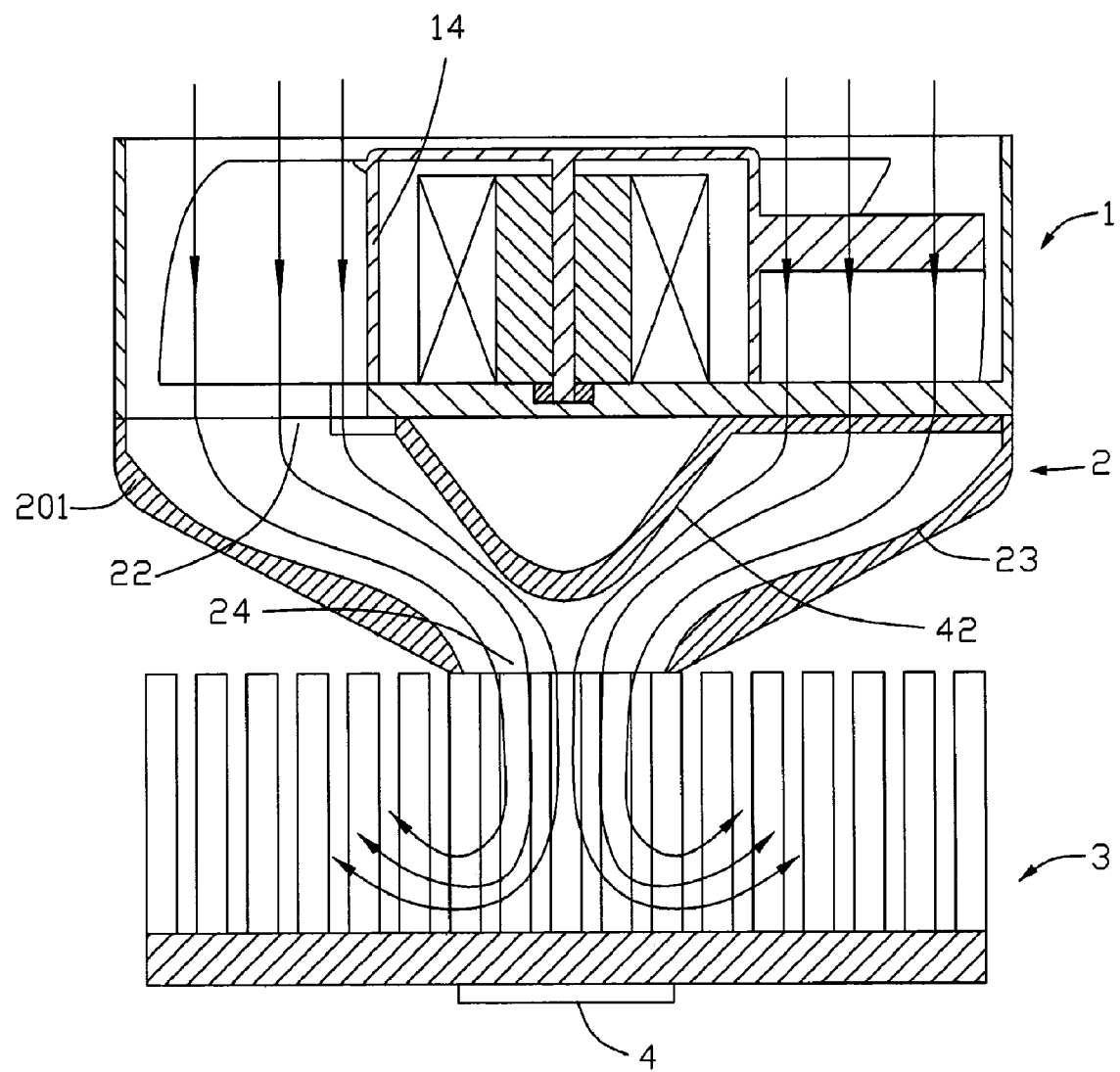
FIG. 4 is a cross sectional view of the cooling fan assembly mounted on a heat sink.
Figure 6:
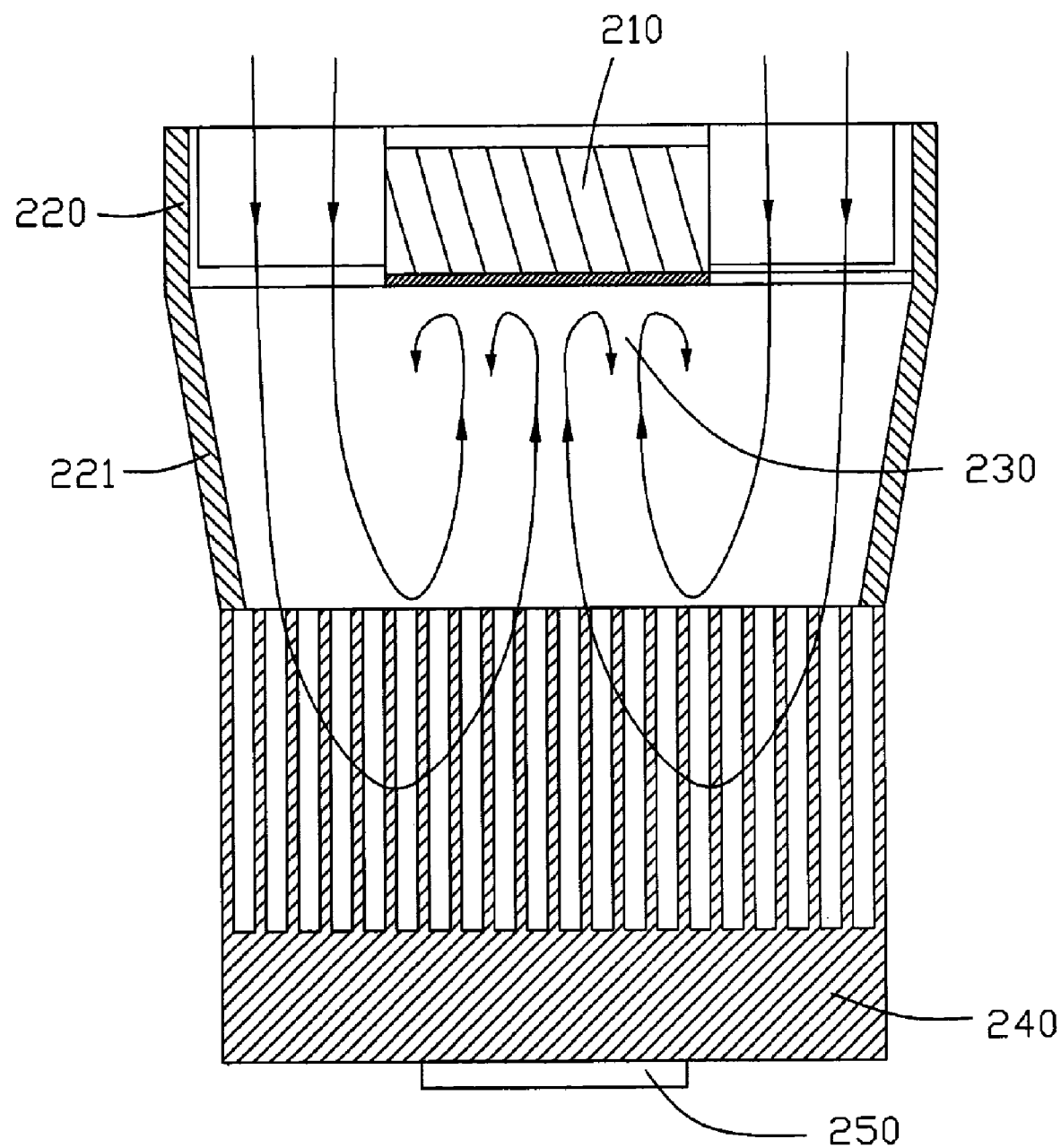
FIG. 6 is a cross sectional view of a conventional cooling fan assembly mounted on the heat sink.

Referring to FIG. 4, when the cooling fan assembly is mounted on a heat sink 3, to which a heat source 4 like a CPU or a chipset is attached, the air outlet 24 of the hood 20 faces the heat source 4. During operation of the cooling fan 1, the original low pressure area occurred in the conventional cooling fan assembly of FIG. 6 is now covered by the guiding member 40. The guiding member 40 covers a bottom wall (not labeled) of the cooling fan 1 just below the rotary hub 14. Accordingly, there is no low pressure area induced during the operation of the cooling fan assembly in accordance with the present invention. An airflow generated by the cooling fan 1 leaves the cooling fan 1, enters the hood 20 through the air inlet 22, and is guided by the streamline-shaped outer surface 42 of the guiding member 42 and inner surface 23 of the central body 201 toward the air outlet 24. Since the air outlet 24 is much smaller than the air inlet 22, the airflow leaves the air outlet 24 with a significantly increased speed and pressure. After leaving the air outlet 24, the airflow with increased speed and pressure blows onto the heat sink 210 at a position directly above the heat source 4, whereby heat of the heat source 4 can be effectively taken away. Since there is no low pressure area in the cooling fan assembly in accordance with the present invention, a turbulent airflow produced by the cooling fan 1 in the air guiding device 2 is thereby prevented.

The inner surface 23 of the central body 201 and the outer surface 42 of the guiding member 40 are streamline shaped. Thus the flow resistance of the airflow through the fan duct device 2 is reduced. For the area enclosed by the central body 20 is gradually reduced along the direction form the air inlet 22 to the air outlet 24, the speed and pressure of the airflow gradually increases from the air inlet 22 to the air outlet 24 of the hood 20. Thus the speed and pressure of the airflow at the air outlet 24 of the hood 20 is very high.

The airflow flowing from the air outlet 24 of the hood 20 to the heat sink 3 is a jet flow. The speed of the airflow is very high. The heat generated by the heat source 4 and transferred to the heat sink 3 concentrates at an area of the heat sink 3 facing the air outlet 24 of the hood 20. The jet flow with high pressure and high speed leaving the air outlet 24 directly impinges on the heat-concentrated area of the heat sink 3 and takes the heat away therefrom; therefore, heat dissipation efficiency of the heat sink 3 is improved.

Figure 5:
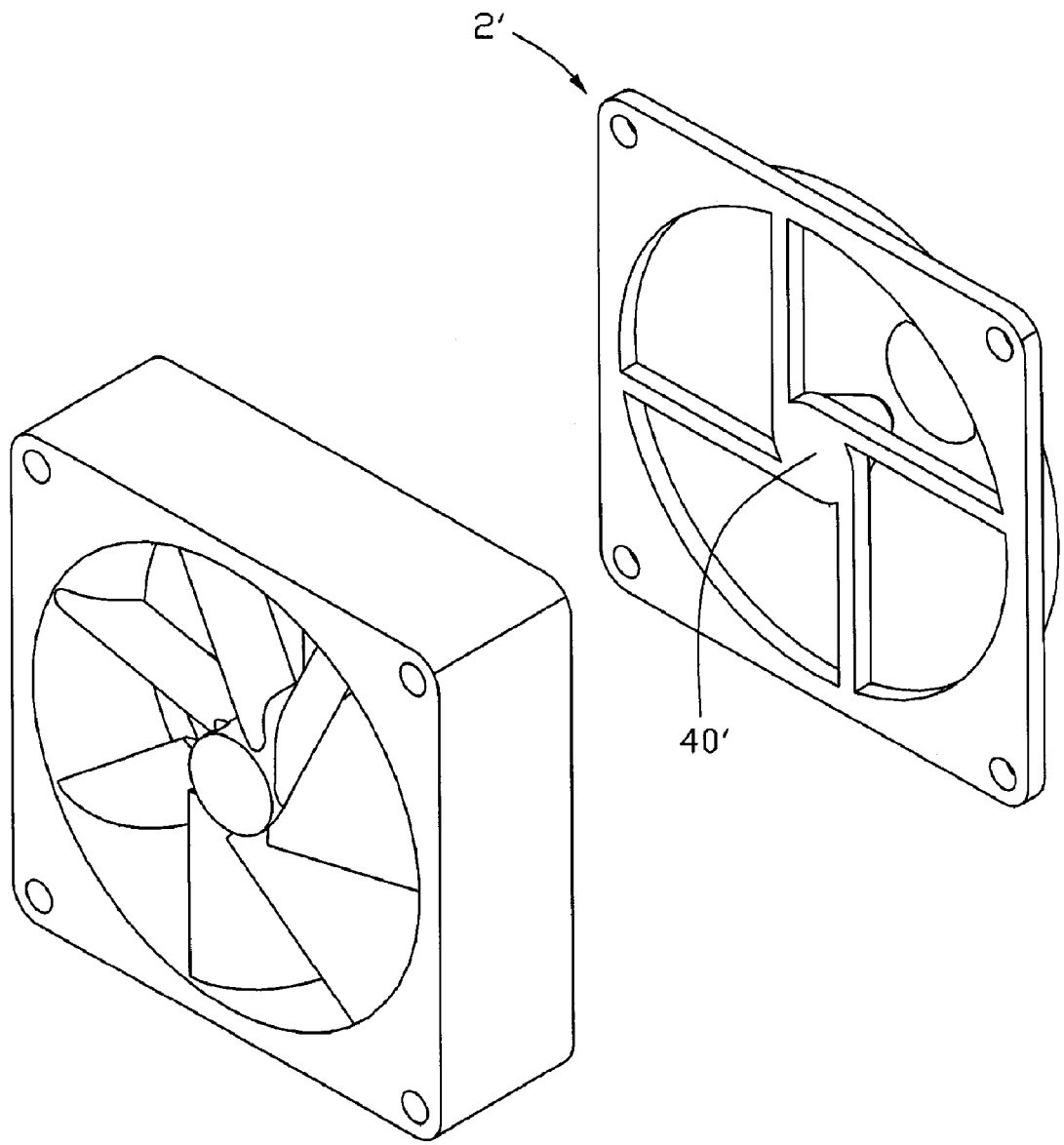
FIG. 5 is a view similar to FIG. 2 but showing a cooling fan assembly in accordance with another embodiment of the present invention.

FIG. 5 illustrates a cooling fan assembly in accordance with an alternative embodiment of the present invention. Except for the guiding member 40', other parts of the cooling fan assembly in accordance with this second embodiment have substantially the same configuration with the cooling fan assembly of the previous first preferred embodiment. In this embodiment, the guiding member 40' is solid, rather than is hollow and has a concave.

The outer surface 42 of the guiding member 40 (40') and the inner surface 23 of the central body 201 are streamline shaped whereby a flow resistance of the airflow through the hood 20 can be substantially reduced. As long as the guiding member 40 and the central body 201 of the hood 20 extend diminishingly toward the air outlet 24, and the air outlet 24 is smaller than the air inlet 22, the speed of the airflow can be increased when leaving the air outlet 24 so that a strong air jet can be generated to blow through the heat sink 3 thereby to effectively take heat away from the heat sink 3.

It is understood that the invention may be embodied in other forms without departing from the spirit thereof. Thus, the present example and embodiment are to be considered in all respects as illustrative and not restrictive, and the invention is not to be limited to the details given herein.

What is claimed is:

1. A cooling fan assembly comprising:
    a cooling fan having a rotary hub and a plurality of fan blades extending radially from an outer periphery of the hub;
    a hood connected with the cooling fan, the hood forming an air inlet near the cooling fan and an air outlet far from the cooling fan; and
    a guiding member located in a center of the hood, the guiding member located close to the hub of the cooling fan and so configured that a low pressure area is prevented from being formed in the hood near the hub, the guiding member guiding an airflow generated by the cooling fan to flow from the air inlet toward the air outlet;
    wherein a flow area between an inner surface of the hood and an outer surface of the guiding member is smoothly changed from convergent to divergent to streamwisely guide the direction and to accelerate the speed of the airflow.

2. The cooling fan assembly as described in claim 1, wherein an area enclosed by the guiding member gradually decreases along a direction from the air inlet to the air outlet of the hood.

3. The cooling fan assembly as described in claim 1, wherein the outer surface of the guiding member is streamline shaped.

4. The cooling fan assembly as described in claim 1, wherein the guiding member is hollow.

5. The cooling fan assembly as described in claim 1, wherein the guiding member is solid.

6. A fan duct comprising:
    a hood comprising an air inlet adapted for receiving an airflow generated by a fan to enter the fan duct and an air outlet adapted for the airflow to leave the fan duct, the air inlet being larger than the air outlet; and
    a guiding member located in a center of the hood, the guiding member having a cone shape with a large end located near the air inlet and a small end located near the air outlet;
    wherein a flow area between an inner surface of the hood and an outer surface of the guiding member is smoothly changed from convergent to divergent to streamwisely guide the direction and to accelerate the speed of the airflow.

7. The fan duct as described in claim 6, an area enclosed by the guiding member gradually decreases along a direction from the air inlet to the air outlet of the hood.

8. The fan duct as described in claim 7, wherein the outer surface of the guiding member is streamline shaped.

9. The fan duct as described in claim 6, wherein the guiding member is hollow.

10. The fan duct as described in claim 6, wherein the guiding member is solid.

11. The fan duct as described in claim 6, wherein the hood has a cone-shaped body and the air inlet is defined in a large end of the body and the air outlet is defined in a smaller end of the body.

12. The fan duct as described in claim 6, wherein a plurality of brackets extend outwardly from an outer periphery of the guiding member and connect the guiding member with the hood.

13. An electronic assembly comprising:
 a cooling fan having a rotary hub and a plurality of fan blades radially, outwardly extending from the hub, and a bottom wall just under the hub;
 a fan duct device secured to the cooling fan, having a hollow body with a large opening adjacent to the cooling fan and a small opening distant from the cooling fan, and a cone-shaped guiding member located in the body, having a large end located adjacent to the cooling fan and covering the bottom wall of the cooling fan just under the hub, wherein an airflow generated by the cooling fan enters the body through the large opening, guided by an inner surface of the body and an outer surface of the guiding member towards the small opening, and leaving the body through the small opening;
 wherein a flow area between an inner surface of the hood and an outer surface of the guiding member is smoothly changed from convergent to divergent to streamwisely guide the direction and to accelerate the speed of the airflow.

14. The electronic assembly as described in claim 13, further comprising a heat-generating electronic component, a heat sink having a central part to which the heat-generating electronic component is attached, wherein the fan duct device is mounted to the heat sink and the small opening faces the heat-generating electronic component, the airflow flowing parallel and concentrated to the central part of the heat sink.

15. The electronic assembly as described in claim 14, wherein the fan duct device comprises a flange extending outwardly from the body near the large opening, the flange secured with the cooling fan.

16. The electronic assembly as described in claim 15, wherein the fan duct device has a plurality of brackets connecting the body and the guiding member at a location adjacent to the large opening, and the fan has a frame supporting the hub thereon, the frame forming a plurality of ribs corresponding to the brackets of the fan duct, each bracket of the fan duct being located just under a corresponding rib of the fan.

17. The electronic assembly as described in claim 16, wherein the body of the fan duct device has a cone shape with a large end located near the cooling fan and a small end located distant from the cooling fan.

18. The electronic assembly as described in claim 13, wherein the guiding member of the fan duct device has a concave facing the hub.

19. The electronic assembly as described in claim 15, wherein the flange forms a four-sided base for the hood, and a hole is defined in each of four corners of the four-sided base, fasteners extending through the holes to engage with the cooling fan.

20. The electronic assembly as described in claim 13, wherein the guiding member is solid.

* * * * *